United States Patent
Botez et al.

(10) Patent No.: US 7,558,305 B2
(45) Date of Patent: Jul. 7, 2009

(54) INTERSUBBAND MID-INFRARED ELECTROLUMINESCENT SEMICONDUCTOR DEVICES

(75) Inventors: Dan Botez, Madison, WI (US); Ali R. Mirabedini, Madison, WI (US); Dapeng P. Xu, Madison, WI (US); Luke J. Mawst, Sun Prairie, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 525 days.

(21) Appl. No.: 11/021,095

(22) Filed: Dec. 21, 2004

(65) Prior Publication Data

US 2005/0226296 A1 Oct. 13, 2005

Related U.S. Application Data

(60) Provisional application No. 60/533,635, filed on Dec. 31, 2003.

(51) Int. Cl.
*H01S 5/00* (2006.01)

(52) U.S. Cl. .............. 372/43.01; 372/44.01; 372/45.01; 372/45.012

(58) Field of Classification Search .............. 372/43.01, 372/44.01, 45.01, 45.012; 257/15, 97
See application file for complete search history.

(56) References Cited

U.S. PATENT DOCUMENTS

| 4,817,110 | A |   | 3/1989 | Tokuda et al. |
| 4,919,507 | A |   | 4/1990 | Evans et al. |
| 4,985,897 | A |   | 1/1991 | Botez et al. |
| 5,200,969 | A | * | 4/1993 | Paoli .......................... 372/50.1 |
| 5,436,194 | A | * | 7/1995 | Kondo et al. ................... 438/40 |
| 5,500,868 | A |   | 3/1996 | Kurihara |
| 5,508,529 | A | * | 4/1996 | Roenker et al. ............... 257/14 |
| 5,734,670 | A | * | 3/1998 | Ono et al. .............. 372/45.012 |
| 5,936,989 | A | * | 8/1999 | Capasso et al. ......... 372/45.012 |

(Continued)

OTHER PUBLICATIONS

Roberto Paiell, "Generation and detection of high-speed pulses of mid-infrared radiation with intersubband semiconductor lasers and detectors" IEEE transactions on pthotons technology letters, vol. 12, No. 7, Jul. 2000, pp. 780-782.*

(Continued)

*Primary Examiner*—Delma R. Forde
(74) *Attorney, Agent, or Firm*—Foley & Lardner LLP

(57) ABSTRACT

A semiconductor laser and light emitting device is defined. The device comprises an electron injector and an active region adjacent to the electron injector. The active region includes at least one deep quantum well with barrier layers adjacent to either side of the quantum well or wells such that electrons injected from the electron injector into a high energy level of the quantum well relax to a lower energy level with the emission of a photon and are transmitted out to a region beyond the last barrier layer of the active region. The electron injector includes quantum well layers. The bottom of each deep quantum well or wells in the active region is lower in energy than the bottoms of the quantum well layers in the electron injector. The device may further comprise at least two stages wherein each stage contains an electron injector and an active region. The stages are separated by semiconductor layers that allow the transfer of electrons from the active region of one stage to the electron injector of the next stage.

33 Claims, 5 Drawing Sheets

U.S. PATENT DOCUMENTS

| | | | | |
|---|---|---|---|---|
| 5,953,356 | A | * | 9/1999 | Botez et al. ............... 372/45.01 |
| 6,167,073 | A | | 12/2000 | Botez et al. |
| 6,195,381 | B1 | * | 2/2001 | Botez et al. ................... 372/96 |
| 6,849,866 | B2 | * | 2/2005 | Taylor .......................... 257/24 |
| 6,907,056 | B2 | * | 6/2005 | Botez ...................... 372/43.01 |
| 2002/0001111 | A1 | | 1/2002 | Evans et al. |
| 2004/0061102 | A1 | * | 4/2004 | Tansu et al. ................... 257/13 |
| 2004/0161006 | A1 | * | 8/2004 | Chang et al. .................. 372/45 |
| 2007/0248131 | A1 | * | 10/2007 | Botez et al. .............. 372/43.01 |
| 2008/0043794 | A1 | * | 2/2008 | Botez ...................... 372/45.01 |
| 2009/0022196 | A1 | * | 1/2009 | Botez et al. ............ 372/45.012 |

OTHER PUBLICATIONS

Ned S. et al. "Quantum-Dot Cascade laser:proposal for an ultralow-threshold semiconductor laser" IEEE Journal Quantum Electronics, vol. 33, No. 7, Jul. 1997. pp. 1170-1173.*

Jasprit Singh "Possibility of room temperature Intra-band lasing in quantum dot structures placed in high photon density cavities" IEEE Photons Chnology letters. vol. 8, No. 4, Apr. 1996, pp. 488-490.*

C.F. Hsu et al. "Intersubband laser design using a quantum box array" SPIE Proceeding 3001- Feb. 1997., pp. 1-11.*

Infrated Laser demostrates a new principle of operation, Physics Today, Jul. 1994, pp. 20-22.*

X. Zahang et al. "0.98 um Multiple Quantum Well Tunneling Injection Laer Extrapolated" pp. 37 and 38.*

Google search (Sep. 11, 2008).*

J. Faist, F. Capasso, D. L. Sivco, C. Sirtori, A. L. Hutchinson, and A. Y. Cho, *Science*, vol. 264, pp. 553, et seq., 1994.

F. Capasso, D. L. Sivco, C. Sirtori, A. L. Hutchinson, S. N. G. Chu, and A. Y. Cho, Conf. Dig. 14th IEEE International Semiconductor Laser Conference, pp. 71-72, Maui, Hi. (Sep. 19-23, 1994).

J. Faist, F. Capasso, C. Sitori, D. L. Sivco, A. L. Hutchinson, and A. Y. Cho, Appl. Phys. Lett., 66, pp. 538-540 (1995).

J. Faist, F. Capasso, C. Sitori, D. L. Sivco, A. L. Hutchinson, S. N. G. Chu, and A. Y. Cho, "Continuous wave quantum cascade lasers in the 4-10 µm wavelength region," SPIE, vol. 2682, San Jose, pp. 198-204, 1996.

J. Faist, F. Capasso, D. L. Sivco, C. Sirtori, A. L. Hutchinson, and A. Y. Cho, "Room temperature mid-infrared quantum cascade lasers," Electron. Lett., vol. 32, pp. 560-561, 1996.

M. Beck, D. Hofstetter, T. Aellen, J. Faist, U. Oesterle, M. Ilegems, E. Gini, and H. Melchior, *Science*, vol. 295, pp. 301-305, 2002.

C-F Hsu, J-S. O, P. Zory and D. Botez, "Intersubband Quantum-Box Semiconductor Lasers," IEEE J. Select. Topics Quntum Electron., vol. 6, 2000, pp. 491-503.

C. Gmachl, et al., "Non-Cascaded Intersubband Injection Lasers at $\lambda=7.7$ µm," Appl. Phys. Lett., vol. 73, No. 26, Dec. 28, 1998, pp. 3830-3832.

C. Sirtori, et al., "GaAs-AlGaAs Quantum Cascade Lasers: Physics, Technology and Prospects," IEEE J. Quantum Electron.,. vol. 38, 2002, pp. 547-558.

S. Barbieri, et al., "Design Strategies for GaAs-based unipolar lasers: optimum injector-active region coupling via resonant tunneling," Appl. Phys. Lett., vol. 78, 2001, pp. 282-284.

C. Sirtori, et al., "Resonant Tunneling in Quantum Cascade Laser Structures," IEEE J. Quantum Electron., vol. 34, 1998, pp. 1722-1729.

Q. K. Yang, et al., "Improvement of $\lambda \approx 5$ µm quantum cascade lasers by blocking barriers," Appl. Phys. Lett., vol. 80, No. 12, Mar. 25, 2002, pp. 2048-2050.

H. Page, et al., "300 K operation of a GaAs-based quantum-cascade laser at $\lambda \approx 9$ µm," Appl. Phys. Lett., vol. 79, No. 22, May 28, 2001, pp. 3529-3531.

D.P. Xu, A. Mirabedini, M. D'Souza, S. Li, D. Botez, A. Lyakh, Y-J. Shen, P. Zory, C. Gmachl, "Room-temperature, mid-infrared ($\lambda = 4.7$ µm) electroluminescence from single -stage intersubband GaAs-based edge emitters," Appl. Phys. Lett., vol. 85, No. 20, Nov. 15, 2004, pp. 1-3.

D. P. Xu, A. Mirabedini, M. D'Souza, S. Li, D. Botez, Y-J Shen, P. Zory, "Room-temperature, mid-IR ($\lambda = 4.7$ µm) electroluminescence from single -stage intersubband GaAs-based edge emitters," Tech. Digest 2004 CLEO/IQEC Conference, paper CMR2, San Francisco, Ca., May 16-21, 2004.

D. Botez, P. Zory, "Intersubband Quantum-Box Semiconductor Lasers," Proc. International Workshop on Quantum Cascade Lasers, Jan. 4-8, 2004, Seville, Spain.

International Search Report issued Apr. 13, 2006 for International Application No. PCT/US2004/043622.

* cited by examiner

| Ref | Layer | Thickness |
|---|---|---|
| 20 | GaAs  $5\times10^{18}/cm^3$ | 1500 nm |
| 16 | GaAs  $2\times10^{17}/cm^3$ | 500 nm |
| 16 | GaAs  $1\times10^{17}/cm^3$ | 500 nm |
| 12 | $Al_{.02}Ga_{.98}As$  $4\times10^{17}/cm^3$ | 4 nm |
| 12 | $Al_{.04}Ga_{.96}As$  $4\times10^{17}/cm^3$ | 3 nm |
| 12 | $Al_{.06}Ga_{.94}As$  $4\times10^{17}/cm^3$ | 3 nm |
| 12 | $Al_{.08}Ga_{.92}As$  $4\times10^{17}/cm^3$ | 3 nm |
| 12 | $Al_{.60}Ga_{.40}As$  $4\times10^{17}/cm^3$ | 7.5 nm |
| 12 | GaAs  $4\times10^{17}/cm^3$ | 3.3 nm |
| 12 | $Al_{.8}Ga_{.2}As$  $4\times10^{17}/cm^3$ | 1.6 nm |
| 12 | GaAs  $4\times10^{17}/cm^3$ | 2.9 nm |
| 12 | $Al_{.8}Ga_{.2}As$  undoped | 2.0 nm |
| 12 | GaAs  undoped | 2.5 nm |
| 14 | $Al_{.8}Ga_{.2}As$  undoped | 2.4 nm |
| 14 | $In_{.3}Ga_{.7}As$  undoped | 4.6 nm |
| 14 | $Al_{.8}Ga_{.2}As$  undoped | 2.4 nm |
| 14 | $In_{.3}Ga_{.7}As$  undoped | 3.6 nm |
| 14 | $Al_{.8}Ga_{.2}As$  undoped | 2.4 nm |
| 18 | GaAs  $1\times10^{17}/cm^3$ | 500 nm |
| 18 | GaAs  $2\times10^{17}/cm^3$ | 500 nm |
| 22 | GaAs  $5\times10^{18}/cm^3$ | 1500 nm |
| 24 | GaAs  $1-9\times10^{18}/cm^3$ | |

FIG. 2

INTERSUBBAND MID-INFRARED ELECTROLUMINESCENT SEMICONDUCTOR DEVICES

CROSS-REFERENCE TO RELATED APPLICATION

This application claims the benefit of provisional patent application No. 60/533,635, filed Dec. 31, 2003, the disclosure of which is incorporated herein by reference.

STATEMENT OF GOVERNMENT RIGHTS

This invention was made with United States government support awarded by the following agency: DOD ARPA N66001-03-1-8900. The United States government has certain rights in this invention.

FIELD OF THE INVENTION

This invention pertains generally to the field of semiconductor lasers and light emitting devices and particularly to intersubband semiconductor light emitters.

BACKGROUND OF THE INVENTION

Semiconductor lasers are formed of multiple layers of semiconductor materials. The conventional semiconductor diode laser typically includes an n-type layer, a p-type layer and an undoped layered active structure between them such that when the diode is forward biased electrons and holes recombine within the active structure with the resulting emission of light. The layers adjacent to the active structure typically have a lower index of refraction than the active structure and form cladding layers that confine the emitted light to the active structure and sometimes to adjacent layers. Semiconductor lasers may be constructed to be either edge-emitting or surface-emitting.

A semiconductor laser that emits photons as electrons from within a given energy band cascade down from one energy level to another, rather than emitting photons from the recombination of electrons and holes, has been reported. See, J. Faist, F. Capasso, D. L. Sivco, C. Sirtori, A. L. Hutchinson, and A. Y. Cho, Science, Vol. 264, pp. 553, et seq., 1994. This device, referred to as a quantum cascade laser (QCL), is the first reported implementation of an intersubband semiconductor laser. The basic light-generation mechanism for this device involves the use of 25 active regions composed of 3 quantum wells each. Injection by resonant tunneling occurs in the energy level (level 3) of the first, narrow quantum well. A radiative transition occurs from level 3, in the first well, to level 2, the upper state of the doublet made by two coupled quantum wells. Quick phonon-assisted relaxation from level 2 to 1 insures that level 2 is depleted so that population inversion between levels 3 and 2 can be maintained. Electrons from level 1 then tunnel through the passive region between active regions, which is designed such that, under bias, it allows such tunneling to act as injection into the next active region. Further developments of this type of device are reported in F. Capasso, J. Faist, D. L. Sivco, C. Sirtori, A. L. Hutchinson, S. N. G. Chu, and A. Y. Cho, Conf. Dig. 14th IEEE International Semiconductor Laser Conference, pp. 71-72, Maui, Hi. (Sep. 19-23, 1994); J. Faist, F. Capasso, C. Sirtori, D. L. Sivco, A. L. Hutchinson, and A. Y. Cho, Appl. Phys. Lett., 66, 538, (1995); J. Faist, F. Capasso, C. Sirtori, D. L. Sivco, A. L. Hutchinson, S. N. G. Chu, and A. Y. Cho, "Continuous wave quantum cascade lasers in the 4-10 µm wavelength region," SPIE, Vol. 2682, San Jose, pp. 198-204, 1996; and J. Faist, F. Capasso, D. L. Sivco, C. Sirtori, A. L. Hutchinson, and A. Y. Cho, "Room temperature mid-infrared quantum cascade lasers," Electron. Left., Vol. 32, pp. 560-561, 1996. More recently continuous wave (CW) operation has been achieved at 300 K, but with very low power conversion efficiency (<0.5%) and only at wavelengths around 9 µm. See M. Beck, D. Hofstetter, T. Aellen, J. Faist, U. Oesterle, M. Ilegems, E. Gini, and H. Melchior, Science, Vol. 295, pp. 301-305, 2002.

Despite this rapid improvement in the performance capabilities of GaInAs/InP-based quantum cascade lasers, it is unlikely that they will ever be able to operate CW at 300 K with high power conversion efficiency (>15%) at wavelengths of interest in the mid-infrared (3 to 5 µm) and far-infrared (8 to 12 µm) wavelength ranges due primarily to the fact that their radiative efficiency is inherently poor. This poor efficiency is quantified by noting that the non-radiative LO-phonon-assisted relaxation time for the upper laser states is about 1.8 ps and the radiative relaxation time is 4.2 ns. One approach to obtaining room temperature CW operation of intersubband semiconductor lasers in the mid-infrared (3 to 5 µm) and far-infrared (8 to 12 µm) ranges involves the use of two-dimensional arrays of quantum boxes, with each quantum box incorporating a single-stage, intersubband transition structure. See C-F Hsu, J-S. O, P. Zory and D. Botez, "Intersubband Quantum-Box Semiconductor Lasers," IEEE J. Select. Topics Quantum Electron., Vol. 6, 2000, pp. 491-503; U.S. Pat. No. 5,953,356 entitled "Intersubband Quantum Box Semiconductor Laser."

Room temperature intersubband emission has been reported for single-stage, unipolar devices only from InP-based structures at wavelengths as short as 7.7 µm. C. Gmachl, et al., "Non-Cascaded Intersubband Injection Lasers at λ=7.7 µm," Appl. Phys. Left., Vol. 73, 1998, pp. 3822-3830. For 30- to 40-stages, GaAs—AlGaAs quantum cascade lasers at room temperature, intersubband emission wavelengths shorter than 8 µm cannot be achieved, since at higher transmission energies, the active-region upper level is apparently depopulated via resonant tunneling between the X valleys of the surrounding AlGaAs barriers. C. Sirtori, et al., "GaAs—AlGaAs Quantum Cascade Lasers: Physics, Technology and Prospects," IEEE J. Quantum Electron., Vol. 38, 2002, pp. 547-558. Optimization studies of GaAs-based devices have shown that for thin barriers between the injector region and the active region, two effects occur which cause significant decreases in the upper level injection efficiency: (1) a diagonal radiative transition from injector-region ground level, g, to an active region lower level, and (2) severe carrier leakage from the level g to the continuum. S. Barbieri, et al., "Design Strategies for GaAs-based unipolar lasers: optimum injector-active region coupling via resonant tunneling," Appl. Phys. Lett., Vol. 78, 2001, pp. 282-284. In addition to these limitations, quantum cascade lasers are conventionally formed of three regions, a superlattice injector, an active region, and a superlattice reflector/transmitter, functioning as a distributed Bragg reflector (DBR), which is identical in structure to the superlattice injector. Fabrication of devices with complicated structures of this type is both difficult and relatively expensive. Furthermore, for such devices the necessary impurity doping in the superlattice injectors causes a significant increase in the room-temperature threshold current density due to excited carriers from the superlattice reflector/transmitter regions that fill the lower levels of prior active regions, thus reducing the population inversion.

SUMMARY OF THE INVENTION

In the present invention, intersubband semiconductor light emitting devices are provided which virtually suppress carrier leakage to the continuum by utilizing very deep active quantum wells sandwiched between very high barrier layers. For GaAs-based devices, for example, $In_{0.3}Ga_{0.7}As$ active layer quantum wells can be sandwiched between $Al_{0.8}Ga_{0.2}As$ barrier layers to provide the very deep quantum wells. In addition, because GaAs/AlGaAs superlattices do not need to be used on both sides of the active region, resonant tunneling cannot occur between X valleys at high transition energies, and thus room temperature emission in the mid-IR range becomes possible for GaAs-based devices and other semiconductor laser devices.

The present invention also allows the devices to be produced by low-pressure metal organic chemical vapor deposition (MOCVD) rather than molecular beam epitaxy (MBE), simplifying and reducing the cost of fabrication.

A semiconductor structure in accordance with the invention includes multiple layers of semiconductor including an electron injector and an active region adjacent to the electron injector. The active region has multiple layers including at least one deep quantum well with barrier layers adjacent to either side of each quantum well such that the electrons injected from the electron injector into a high energy level of the quantum well or wells relax to a lower energy level with the emission of a photon and are transmitted out to a region beyond the last barrier layer of the active region. Preferably, there are at least two deep quantum wells in the active region. The electron injector has multiple layers including quantum well layers. The bottom of each deep quantum well in the active region is lower in energy than the bottoms of the quantum well layers in the injector. The semiconductor structure further includes an upper confinement layer and an upper cladding layer above the electron injector and the active region and a lower confinement layer, a lower cladding layer, and a substrate below the electron injector and the active region. The substrate may be formed of GaAs and the injector formed of multiple layers of GaAs and AlGaAs. The active region may have barrier layers of AlGaAs and quantum wells of InGaAs. For such a structure, the upper and lower confinement layers and the upper and lower cladding layers are formed of GaAs. The semiconductor structure may be formed to generate light at shorter wavelengths (e.g., 2.5 μm to 3.5 μm) by incorporating nitrogen in the quantum wells of the active region.

Another semiconductor structure in accordance with the invention comprises multiple layers of semiconductor including consecutive stages, each stage containing an electron injector and an active region adjacent to the electron injector. The active region has multiple layers including at least one deep quantum well with barriers adjacent to either side of the quantum well such that the electrons injected from the electron injector into a high energy level of the quantum well or wells relax to a lower energy level with the emission of a photon and are transmitted to a region beyond the last barrier layer of the active region. The electron injector has multiple layers including quantum well layers. The bottom of each deep quantum well in the active region is lower in energy than the bottoms of the quantum well layers in the injector. The stages are separated by semiconductor layers that allow the transfer of electrons from the active region of one stage to the electron injector of the next stage. For such devices, the compressive strain of the deep quantum well or wells in the active region is compensated with tensilely-strained barriers placed between the deep quantum well or wells and the high barrier layers. For a structure grown on GaAs with an active region composed of quantum wells of InGaAs and high barriers of AlGaAs, the tensilely-strained barriers may be made of GaAsP.

Further objects, features and advantages of the invention will be apparent from the following detailed description when taken in conjunction with the accompanying drawings.

BRIEF DESCRIPTION OF THE DRAWINGS

In the drawings:

FIG. 2 is a simplified cross-sectional view of an example of a multilayer structure of a semiconductor light emitter in accordance with the invention. All doping levels are n-type with the dopant being Si.

DETAILED DESCRIPTION OF THE INVENTION

Figure 1:
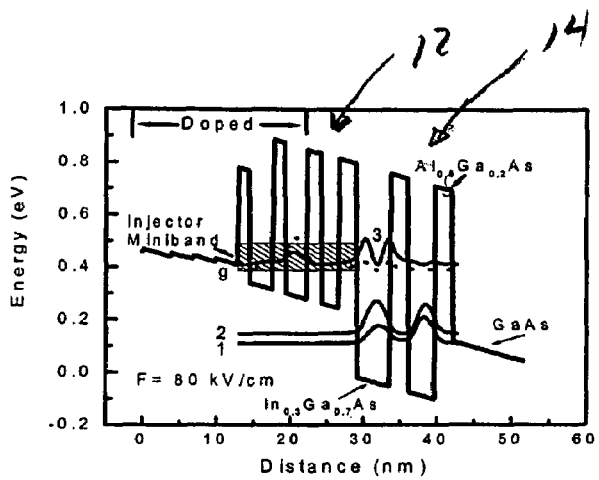
FIG. 1 is a conduction-band-energy diagram of the injector and active region of the device of the invention when energy levels g and n=3 are at resonance, under an applied electric field F=80 kV/cm.

For purposes of exemplifying the invention, a conduction band energy diagram of an injector region 12 and a double quantum well (DQW) active region 14 for a device in accordance with the invention is shown in FIG. 1. The injector 12 and the DQW active region 14 are inserted in the middle of a plasmon-enhanced n-GaAs waveguide. See, S. Barbieri, et al., 2001, supra, and C. Sirtori, 2002, supra. FIG. 1 shows the moduli squared of the relevant wave functions (solid curves for the n=3, n=2 and n=1 states and a dotted curve for the g state). The injector region is n-type doped ($4\times10^{17}$ cm$^{-3}$) over the indicated range, and corresponds to a donor sheet density of $3.7\times10^{11}$ cm$^{-2}$ in the superlattice section. A simplified cross-section of the layers in the transverse direction is shown in FIG. 2, with exemplary compositions, doping levels, and thicknesses of the various layers indicated thereon. As illustrated in FIG. 2, the injector 12 and the active region 14 are formed between a GaAs upper confinement layer 16 and a GaAs lower confinement layer 18. An upper cladding layer 20 of GaAs is formed over the upper confinement layer 16 and a lower cladding layer of GaAs 22 is formed between the substrate 24 and the lower confinement layer 18. The GaAs/AlGaAs superlattice within the injector 12 was designed for tunneling to level n=3 of the active region at a field of 80 kV/cm. The DQW active region 14 was designed for a vertical radiative transition of 273 meV (i.e., λ=4.71 μm). The energy splitting at resonance between the g level (of the injector) and the n=3 state is about 8.4 meV, which leads to strong coupling. See, C. Sirtori, et al., "Resonant Tunneling in Quantum Cascade Laser Structures," IEEE J. Quantum Electron., Vol. 34, 1998, pp. 1722-1729. In turn, the oscillator strength is distributed between two optical transitions: a diagonal one from level g to the n=2, and a vertical one from the n=3 to the n=2 level. Current confinement is provided by contact metal stripes 26 (e.g., 80 μm wide) as the top electrode, and a bottom electrode 30 may be formed on the bottom face of the substrate so that current can flow between the electrodes transversely through the device. The example devices are 300 μm long and mounted on copper heatsinks (not shown in FIG. 2).

Figure 3:
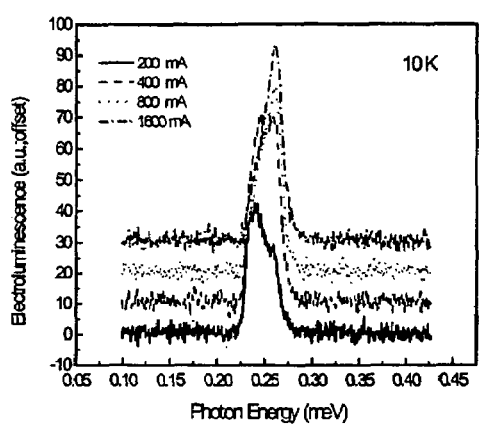
FIG. 3 are diagrams showing intersubband electro-luminescence spectra at 10 K for four different currents under pulse conditions (about 200 ns, 84 kHz) for an exemplary light emitter in accordance with the invention.
Figure 4:
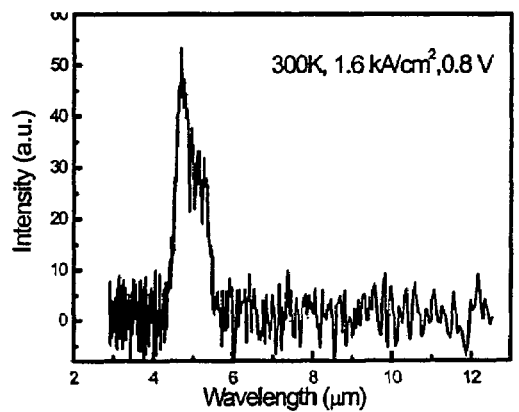
FIG. 4 is a diagram showing the intersubband electroluminescence spectrum at room temperature and 400 mA drive current (i.e., 1.6 kA/cm$^2$ current density) for an exemplary semiconductor light emitter in accordance with the invention.

The spectra of the light emitted from the example devices as a function of drive and temperature are shown in FIGS. 3 and 4. (Drive conditions: ~200 ns-wide pulses; 84 kHz rep. rate). At T=10 K and low drive levels as shown in FIG. 3, the electron population in the g level is much higher than that in the n=3 level, which causes the diagonal low-energy transition at ~240 meV to dominate. The emission FWHM (full width half maximum) is large (~35 meV), as was found by Barbieri, et al., supra, for thin-barrier quantum cascade devices. As the field increases, the population of the n=3 level increases, which causes a shift of the emission to primarily the vertical, high-energy transition at 259 meV (λ=4.78 μm). Increasing the temperature to 300 K (FIG. 4) further increases the n=3 level population, such that most emission occurs from the vertical transition at λ=4.7 μm. The FWHM of the 4.7 μm emission linewidth is ~25 meV, a value comparable to the best RT values reported for quantum cascade devices in C. Barbieri, et al., supra, and C. Sirtori, et al., 1998, supra.

Figure 5:
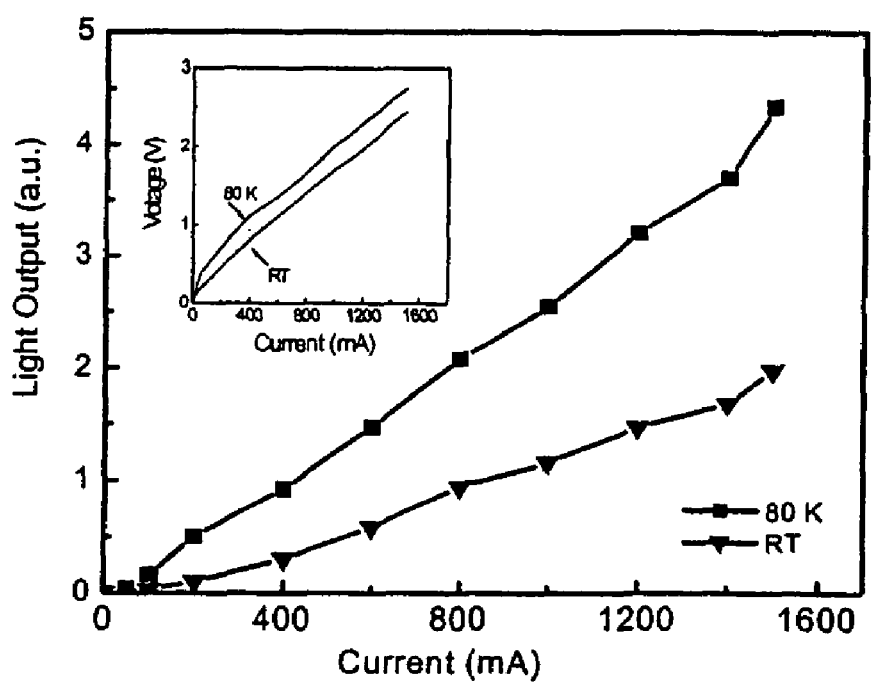
FIG. 5 is a diagram showing light-current curves under pulsed-drive conditions (1 μs, 4 kHz) at 80 K and at room temperature for an exemplary semiconductor light emitter in accordance with the invention, with the inset showing the voltage-current characteristics of the device.

FIG. 5 shows the light-current (L-I) characteristics for the example device at 80 K and 300 K. The outputs are comparable (i.e., several μWs) to those from 30-stage subthreshold quantum cascade devices. (Drive conditions: 1 μs-wide pulsed; 4 kHz rep. rate). Due both to deep wells as well as the high barriers, (thermionic) carrier leakage from the upper energy level; that is, the n=3 level, to the continuum is negligible by comparison to that observed for conventional quantum cascade devices. The fact that the ratio of 80 K to 300 K emissions is only 2.2, compared to typical values of ~3.3 for quantum cascade devices is proof of much lower carrier leakage for deep well devices than for conventional quantum cascade devices. The lower carrier leakage for deep well devices versus conventional quantum cascade devices is a direct consequence of much higher energy difference between the tops of the barriers and the upper energy level in the active region. For instance, as seen in FIG. 1, the difference in energy between the top of the exit barrier and the n=3 level is ~360 meV, a value about four times larger than for conventional 5 μm-emitting quantum cascade devices (see J. Faist, F. Capasso, D. L. Sivco, C. Sirtori, A. L. Hutchinson, and A. Y. Cho, "Room temperature mid-infrared quantum cascade lasers," Electron. Lett., Vol. 32, pp. 560-561, 1996). That is made possible by the fact that for deep well devices the lower energy levels are below (lower in energy than) the bottoms of the quantum wells in the injector (see levels n=2 and n=1 in FIG. 1) something that is not possible in conventional quantum cascade devices (see J. Faist, F. Capasso, D. L. Sivco, C. Sirtori, A. L. Hutchinson, and A. Y. Cho, "Room temperature mid-infrared quantum cascade lasers," Electron. Lett., Vol. 32, pp. 560-561, 1996). In turn, for the same value of the transition energy (i.e., the difference between the upper and lower energy levels) deep well devices by comparison to conventional quantum cascade devices will always have upper energy levels much lower in energy than the tops of the barriers, and thus much less carrier leakage to the continuum. The inset of FIG. 5 shows the V-I curves: at a current density of 1.6 kA/cm$^2$ the voltage is only 0.8 V at room temperature, in good agreement with theory.

Figure 6:
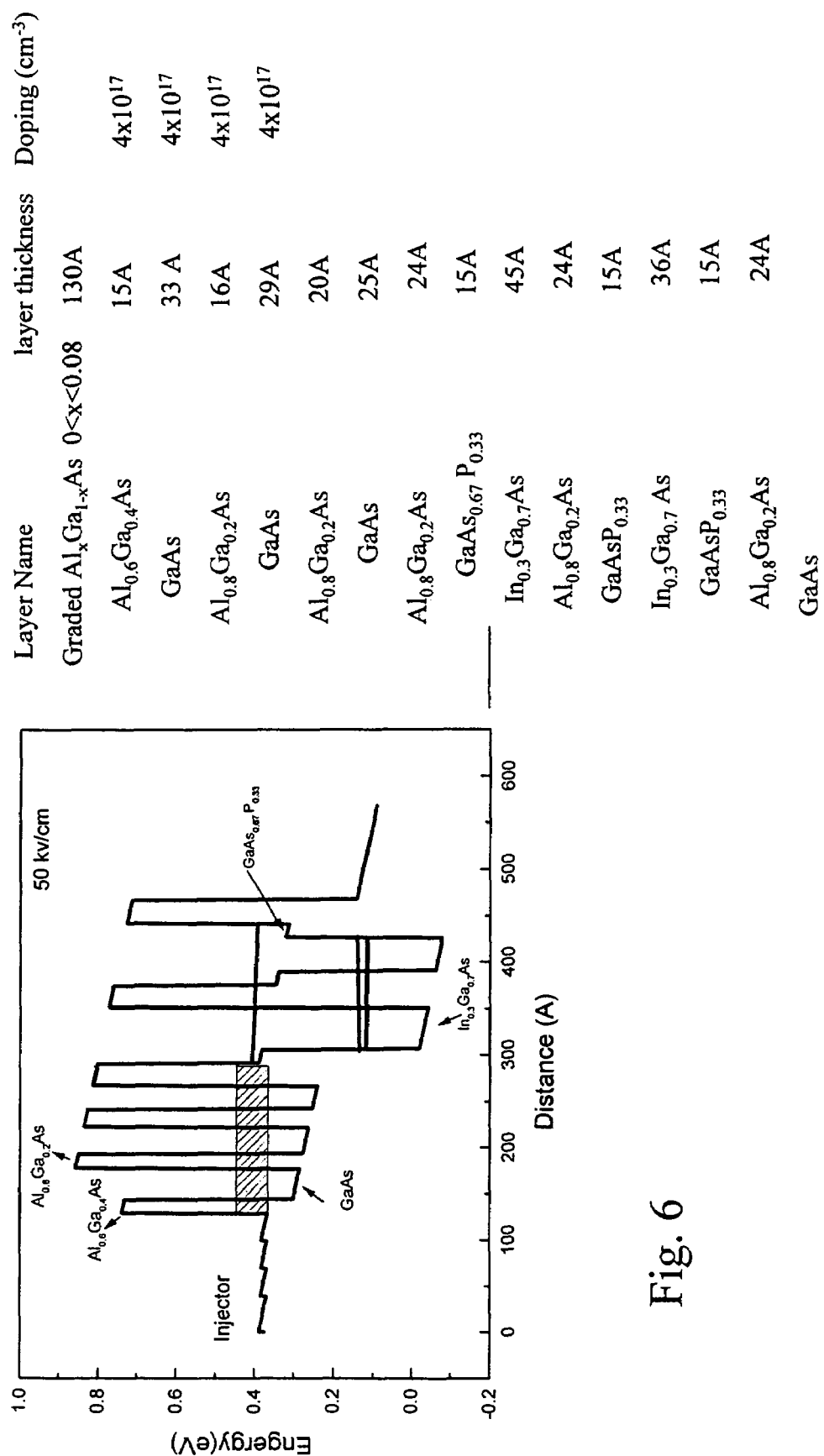
FIG. 6 is a conduction band energy diagram of the injector and active region for a device in accordance with the invention using tensilely-strained barriers placed between the deep quantum wells and the high barriers for strain compensation.

FIG. 6 illustrates the conduction band energy diagram for an embodiment of the invention incorporating tensilely-strained barriers between the deep quantum wells and the high barrier layers in the active region 14 to provide a strain-compensated structure. Exemplary constituents, layer thicknesses, and doping levels for the layers of the injector 12 and active region 14 are also provided in FIG. 6. The waveguide layers and cladding layers 16, 18, 20, 22 and substrate 24 may be as shown in FIG. 2.

Figure 7:
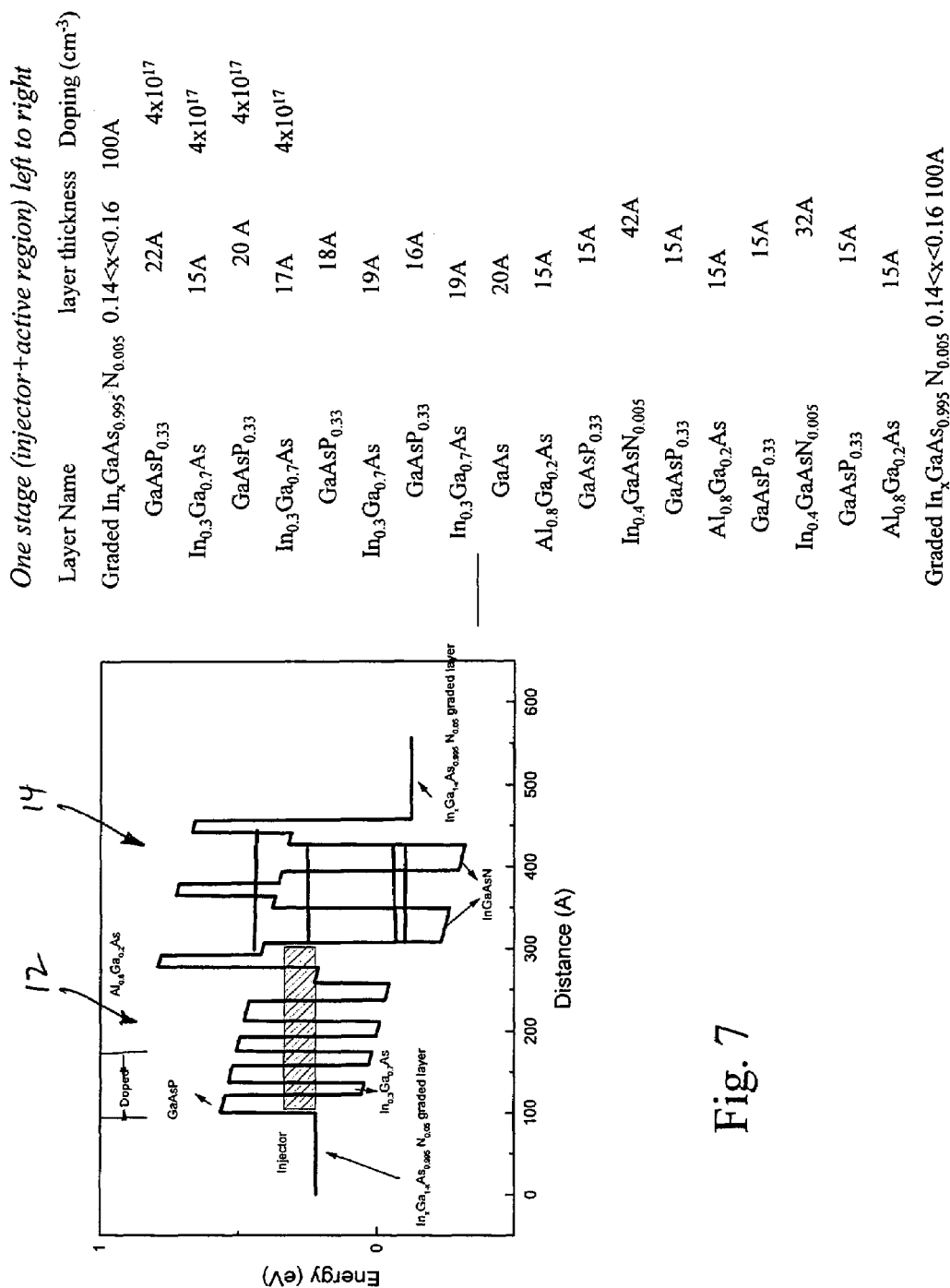
FIG. 7 is a conduction band energy diagram of the injector and active region for a device in accordance with the invention with nitrogen provided in the deep quantum wells for lasing at shorter wavelengths (2.5 to 3.5 μm).

FIG. 7 illustrates the conduction band energy diagram for an embodiment of the invention incorporating nitrogen in the quantum wells of the active region 14 to provide light generation at shorter wavelengths, e.g., 2.5 μm to 3.5 μm. Exemplary constituents, layer thicknesses and doping levels for the layers of the injector 12 and active region 14 are also provided in FIG. 7. The waveguide layers and cladding layers 16, 18, 20, 22 and substrate 24 may be as shown in FIG. 2.

It is understood that the present invention may be implemented in other material systems such as InP, and that the invention may be implemented as a laser by providing means for providing enough optical gain for lasing action, or as a basic light emitter without optical gain. The invention may also be implemented by incorporating the injector and active region, etc., in quantum boxes as shown in U.S. Pat. No. 5,953,356, the disclosure of which is incorporated herein by reference. In the quantum-boxes approach, it is preferred that the energy difference between the top of the barrier layers and the upper energy level in the quantum well or wells of the active region be larger than the energy difference between the upper and lower energy levels in the quantum well or wells of the active region to prevent carrier loss due to intersubband Auger recombination. The invention may also be implemented in multi-stage structures (i.e., cascade-like structures). Generally, for utilization as a laser, multi-stage structures would be preferred. In such structures, for the examples shown in FIGS. 1 and 6, the GaAs layers between each prior stage of the active region and the next stage injector can be undoped (nominally $3\times10^{16}$ cm$^{-3}$) and 5-20 nm or, preferably 5-10 nm thick. In addition, the first four layers of the injector for each stage below the top stage (for FIG. 2, from the layer with Al$_{0.02}$ to the layer with Al$_{0.08}$) can also be undoped. The quantum well thicknesses and compositions may be selected as appropriate, and may contain both InGaAs for the well as well as GaAsP barriers between the well and the high AlGaAs barriers.

It is understood that the invention is not confined to the particular embodiments set forth herein as illustrative, but embraces all such forms thereof as come within the scope of the following claims.

What is claimed is:

1. A semiconductor structure comprising:
multiple layers of semiconductor including an electron injector and an active region adjacent to the electron injector, the active region having multiple layers including at least two deep quantum wells with barrier layers adjacent to the sides of the quantum wells such that the electrons injected from the electron injector into a high energy level of the quantum wells relax to a lower energy level with the emission of a photon and are transmitted out to a region beyond the last barrier layer of the active region, the electron injector having multiple layers including quantum well layers, and wherein the bottom of each deep quantum well in the active region is lower in energy than the bottoms of the quantum well layers in the injector.

2. The semiconductor structure of claim 1 further including an upper confinement layer and an upper cladding layer above the electron injector and the active region and a lower confinement layer, a lower cladding layer, and a substrate below the electron injector and the active region.

3. The semiconductor structure of claim 2 wherein the substrate is formed of GaAs, the injector is formed of multiple layers including GaAs and AlGaAs layers as a superlattice, and wherein the active region has barrier layers of AlGaAs and deep quantum wells of InGaAs.

4. The semiconductor structure of claim 2 wherein the substrate is formed of GaAs, the injector is formed of multiple layers including quantum well layers, and wherein the active region has barrier layers of which at least one is tensilely strained material.

5. The semiconductor structure of claim 2 wherein the substrate is formed of GaAs, the injector is formed of multiple layers including GaAs and AlGaAs layers as a superlattice, and wherein the active region has barrier layers of AlGaAs and GaAsP and deep quantum wells of InGaAs.

6. The semiconductor structure of claim 2 wherein the upper and lower confinement layers and the upper and lower cladding layers are formed of GaAs.

7. The semiconductor structure of claim 1 wherein the deep quantum wells of the active region include nitrogen.

8. The semiconductor structure of claim 1 wherein the energy difference between the top of the highest barrier layer and the upper energy level in the quantum wells in the active region is larger than the energy difference between the upper and lower energy levels in the quantum wells in the active region.

9. A semiconductor structure comprising:
at least two stages, each stage comprising multiple layers of semiconductor including an electron injector and an active region adjacent to the electron injector, the active region having multiple layers including at least two deep quantum wells with barrier layers adjacent to either sides of the quantum wells such that the electrons injected from the electron injector into a high energy level of the quantum wells relax to a lower energy level with the emission of a photon and are transmitted out to a region beyond the last barrier layer of the active region, the electron injector having multiple layers including quantum well layers, and wherein the bottom of each deep quantum well in the active region is lower than the bottoms of the quantum well layers in the injector, and wherein the stages are separated by semiconductor layers that allow the transfer of electrons from the active region of one stage to the electron injector of the next stage.

10. The semiconductor structure of claim 9 wherein the semiconductor layers separating the stages are 5-20 nm thick.

11. The semiconductor structure of claim 9 further including an upper confinement layer and an upper cladding layer above the stages and a lower confinement layer, a lower cladding layer, and a substrate below the stages.

12. The semiconductor structure of claim 11 wherein the substrate is formed of GaAs, the injector is formed of multiple layers including GaAs and AlGaAs layers as a superlattice, and wherein the active region has barrier layers of AlGaAs and deep quantum wells of InGaAs.

13. The semiconductor structure of claim 11 wherein the substrate is formed of GaAs, the injector is formed of multiple layers including quantum well layers, and wherein the active region has barrier layers of which at least one is tensilely strained material.

14. The semiconductor structure of claim 11 wherein the substrate is formed of GaAs, the injector is formed of multiple layers of GaAs and AlGaAs as a superlattice, and wherein the active region has barrier layers of AlGaAs and GaAsP and deep quantum wells of InGaAs.

15. The semiconductor structure of claim 11 wherein the upper and lower confinement layers and the upper and lower cladding layers are formed of GaAs.

16. The semiconductor structure of claim 9 wherein the deep quantum well or wells of the active region include nitrogen.

17. The semiconductor structure of claim 9 wherein the energy difference between the top of the highest barrier layer and the upper energy level in the quantum wells in the active region is larger than the energy difference between the upper and lower energy levels in the quantum wells in the active region.

18. A semiconductor structure comprising:
multiple layers of semiconductor including an electron injector and an active region adjacent to the electron injector, the active region having multiple layers including at least one deep quantum well with barrier layers adjacent to the sides of the quantum well or wells such that the electrons injected from the electron injector into a high energy level of the quantum wells relax to a lower energy level with the emission of a photon and are transmitted out to a region beyond the last barrier layer of the active region, the electron injector having multiple layers including quantum well layers, and wherein the bottom of each deep quantum well in the active region and the lower energy level or levels in each deep quantum well are lower in energy than the bottoms of the quantum well layers in the injector.

19. The semiconductor structure of claim 18 further including an upper confinement layer and an upper cladding layer above the electron injector and the active region and a lower confinement layer, a lower cladding layer, and a substrate below the electron injector and the active region.

20. The semiconductor structure of claim 19 wherein the substrate is formed of GaAs, the injector is formed of multiple layers including GaAs and AlGaAs layers as a superlattice, and wherein the active region has barrier layers of AlGaAs and deep quantum wells of InGaAs.

21. The semiconductor structure of claim 19 wherein the substrate is formed of GaAs, the injector is formed of multiple layers including quantum well layers, and wherein the active region has barrier layers of which at least one is tensilely strained material.

22. The semiconductor structure of claim 19 wherein the substrate is formed of GaAs, the injector is formed of multiple layers including GaAs and AlGaAs layers as a superlattice, and wherein the active region has barrier layers of AlGaAs and GaAsP and deep quantum wells of InGaAs.

23. The semiconductor structure of claim 19 wherein the upper and lower confinement layers and the upper and lower cladding layers are formed of GaAs.

24. The semiconductor structure of claim 18 wherein the at least one deep quantum well of the active region includes nitrogen.

25. The semiconductor structure of claim 18 wherein the energy difference between the top of the highest barrier layer and the upper energy level or levels in the at least one deep quantum well in the active region are larger than the energy difference between the upper and lower energy levels in the quantum wells in the active region.

26. A semiconductor structure comprising:
at least two stages, each stage comprising multiple layers of semiconductor including an electron injector and an active region adjacent to the electron injector, the active region having multiple layers including at least one deep quantum well with barrier layers adjacent to the sides of the quantum well or wells such that the electrons injected from the electron injector into a high energy level of the quantum wells relax to a lower energy level with the emission of a photon and are transmitted out to a region beyond the last barrier layer of the active region, the electron injector having multiple layers including quantum well layers, and wherein the bottom of each deep quantum well in the active region and the lower energy level or levels in each deep quantum well are lower in energy than the bottoms of the quantum well layers in the injector, and wherein the stages are separated by semiconductor layers that allow the transfer of electrons from the active region of one stage to the electron injector of the next stage.

27. The semiconductor structure of claim 26 further including an upper confinement layer and an upper cladding layer above the stages and a lower confinement layer, a lower cladding layer, and a substrate below the stages.

28. The semiconductor structure of claim 27 wherein the substrate is formed of GaAs, the injector is formed of multiple layers including GaAs and AlGaAs layers as a superlattice, and wherein the active region has barrier layers of AlGaAs and deep quantum wells of InGaAs.

29. The semiconductor structure of claim 27 wherein the substrate is formed of GaAs, the injector is formed of multiple layers including quantum well layers, and wherein the active region has barrier layers of which at least one is tensilely strained material.

30. The semiconductor structure of claim 27 wherein the substrate is formed of GaAs, the injector is formed of multiple layers including GaAs and AlGaAs layers as a superlattice, and wherein the active region has barrier layers of AlGaAs and GaAsP and deep quantum wells of InGaAs.

31. The semiconductor structure of claim 27 wherein the upper and lower confinement layers and the upper and lower cladding layers are formed of GaAs.

32. The semiconductor structure of claim 26 wherein the at least one deep quantum well of the active region includes nitrogen.

33. The semiconductor structure of claim 26 wherein the energy difference between the top of the highest barrier layer and the upper energy level or levels in the at least one deep quantum well in the active region are larger than the energy difference between the upper and lower energy levels in the quantum wells in the active region.

* * * * *

UNITED STATES PATENT AND TRADEMARK OFFICE
CERTIFICATE OF CORRECTION

| | | |
|---|---|---|
| PATENT NO. | : 7,558,305 B2 | Page 1 of 1 |
| APPLICATION NO. | : 11/021095 | |
| DATED | : July 7, 2009 | |
| INVENTOR(S) | : Daniel Botez et al. | |

It is certified that error appears in the above-identified patent and that said Letters Patent is hereby corrected as shown below:

<u>Col. 1, Lines 15-16</u>

Delete the phrase "DOD ARPA N66001-03-1-8900" and replace with --NAVY N66001-1-03-1-8900--.

Signed and Sealed this

Twenty-second Day of September, 2009

David J. Kappos
*Director of the United States Patent and Trademark Office*

UNITED STATES PATENT AND TRADEMARK OFFICE
CERTIFICATE OF CORRECTION

PATENT NO. : 7,558,305 B2  Page 1 of 1
APPLICATION NO. : 11/021095
DATED : July 7, 2009
INVENTOR(S) : Botez et al.

It is certified that error appears in the above-identified patent and that said Letters Patent is hereby corrected as shown below:

On the Title Page

Item [*] Notice:    Subject to any disclaimer, the term of this patent is extended or adjusted under 35 USC 154(b) by (525) days Delete the phrase "by 525 days" and insert -- by 348 days --

Signed and Sealed this

Twenty-second Day of June, 2010

David J. Kappos
*Director of the United States Patent and Trademark Office*